(12) United States Patent
Ho et al.

(10) Patent No.: US 9,354,649 B2
(45) Date of Patent: May 31, 2016

(54) BUFFER CIRCUIT FOR A LDO REGULATOR

(71) Applicant: QUALCOMM Incorporated, San Diego, CA (US)

(72) Inventors: Ngai Yeung Ho, Singapore (SG);
Liangguo Shen, San Diego, CA (US);
Bing Liu, San Diego, CA (US);
Vincenzo F Peluso, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 304 days.

(21) Appl. No.: 14/171,538

(22) Filed: Feb. 3, 2014

(65) Prior Publication Data

US 2015/0220094 A1    Aug. 6, 2015

(51) Int. Cl.
| G05F 1/565 | (2006.01) |
| G05F 3/30 | (2006.01) |
| G05F 1/575 | (2006.01) |
| G05F 1/56 | (2006.01) |
| G05F 1/618 | (2006.01) |
| H03K 19/0175 | (2006.01) |

(52) U.S. Cl.
CPC ........ *G05F 1/575* (2013.01); *G05F 1/56* (2013.01); *G05F 1/618* (2013.01); *H03K 19/017518* (2013.01)

(58) Field of Classification Search
CPC ............ G05F 1/565; G05F 1/575; G05F 3/30
USPC ........... 323/273, 275, 311, 312, 315; 327/542
See application file for complete search history.

(56) References Cited

U.S. PATENT DOCUMENTS 4,825,174 A * 4/1989 Vella-Coleiro ......... H03F 1/309
330/264
5,412,262 A 5/1995 Nishio et al.
(Continued)

FOREIGN PATENT DOCUMENTS

EP    1376867 A1    1/2004
JP    H03196670 A    8/1991

OTHER PUBLICATIONS

Fiez TS., et al.,"High performance BiCMOS analog circuit techniques", 19890508; 19890508-19890511, May 8, 1989, pp. 655-658, XP010084894.

(Continued)

*Primary Examiner* — Jeffrey Sterrett
(74) *Attorney, Agent, or Firm* — Fountainhead Law Group P.C.

(57) ABSTRACT

In one embodiment, a circuit includes a first transistor having a control terminal, a first terminal, and a second terminal where the first transistor is a first device type. The control terminal of the first transistor receives an input signal. The circuit also includes a second transistor having a control terminal, a first terminal, and a second terminal where the second transistor is a second device type. The control terminal of the second transistor is coupled to the second terminal of the first transistor. A voltage shift circuit has an input coupled to the first terminal of the first transistor and an output coupled to the first terminal of the second transistor and a voltage between the input of the voltage shift circuit and an output of the voltage shift circuit increases as a current from the output of the voltage shift circuit increases.

20 Claims, 8 Drawing Sheets

(56) References Cited

U.S. PATENT DOCUMENTS

| | | | | |
|---|---|---|---|---|
| 5,955,893 | A * | 9/1999 | Chang | H03K 19/0013 326/121 |
| 6,246,221 | B1 | 6/2001 | Xi | |
| 6,501,305 | B2 | 12/2002 | Rincon-Mora et al. | |
| 7,656,224 | B2 | 2/2010 | Perez et al. | |
| 7,755,338 | B2 * | 7/2010 | Taha | G05F 1/565 323/280 |
| 8,390,491 | B2 * | 3/2013 | Wakimoto | G05F 1/56 323/312 |
| 8,513,929 | B2 * | 8/2013 | Drebinger | G05F 1/575 323/273 |
| 2012/0300606 | A1 * | 11/2012 | Li | H01S 5/042 369/100 |
| 2015/0220094 | A1 * | 8/2015 | Ho | G05F 1/575 323/280 |

OTHER PUBLICATIONS

International Search Report and Written Opinion—PCT/US2015/014253—ISA/EPO—Apr. 13, 2015.

Shyoukh Alm., et al., "A Transient-Enhanced 20I 1/4 A-Quiescent 200mA-Load Low-Dropout Regulator With Buffer Impedance Attenuation", Conference 2006, IEEE Custom Integrated Circuits, IEEE, Piscataway, NJ, USA, Sep. 10, 2006, pp. 615-618, XP031507379, ISBN: 978-1-4244-0075-1.

Wang J., et al., "A 200 mA low-area, low-noise, low-dropout linear regulator for monolithic active pixel sensors", Industrial Electronics and Applications (ICIEA), 2011 6th IEEE Conference on, IEEE, Jun. 21, 2011, pp. 2693-2697, XP032006483, DOI: 10.1109/ICIEA.2011.5976052, ISBN: 978-1-4244-8754-7.

Al-Shyoukh M., et al., "A Transient-Enhanced Low-Quiescent Current Low-Dropout Regulator With Buffer Impedance Attenuation," IEEE Journal of Solid-State Circuits, vol. 42 (8), Aug. 2007, pp. 1732-1742.

Liu S., et al., "A High Performance Low-Dropout Regulator with a Novel Buffer," International Conference on Electric Information and Control Engineering (ICEICE), Apr. 2011, pp. 993-996.

* cited by examiner (with voltage shifter)

(without voltage shifter)

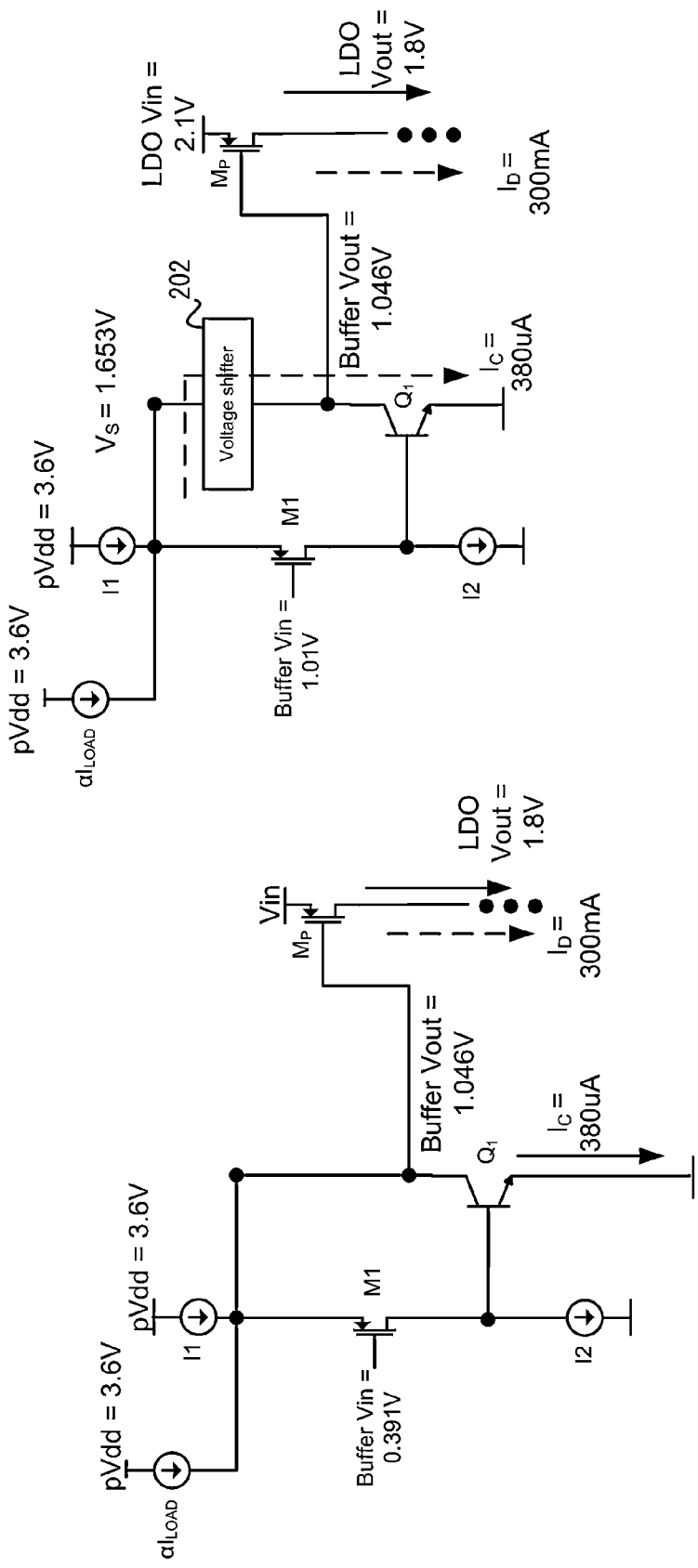
FIG. 4A (without voltage shifter)
FIG. 4B (with voltage shifter)

BUFFER CIRCUIT FOR A LDO REGULATOR

BACKGROUND

The present disclosure relates to electronic circuits and methods, and in particular, to buffer circuits and methods.

Buffer circuits are used widely in a variety of electronic circuit applications. Buffer circuits are often used to allow different functional circuits to work together to perform signal processing tasks. For example, FIG. 1A illustrates an application of a buffer circuit 102. In this example, a signal Vin is amplified by an amplifier 101. Amplifier may be a high gain amplifier that increases a voltage amplitude of Vin, but has a low output current and/or a constrained output voltage range. It may be desirable to provide the amplified version of Vin to another processing circuit 103, referred to here as a load circuit. Load circuit 103 may require a larger input current or voltage range for proper operation than amplifier 101 is capable of producing. Accordingly, in this example, a buffer circuit 103 may be receive the amplified version of Vin and generate a signal with enough current and across a wide enough voltage range to meet the requirements of load circuit 103. Different buffer circuits may increase current, voltage, or both, for example, to allow different functional circuits to process signals in a signal path.

One example use of a buffer circuit is in a low drop out (LDO) regulator. A low drop out (LDO) regulator is a voltage regulator that can operate with a very small input-output differential voltage. FIG. 1B shows an example LDO. The LDO includes a pass transistor 100, an error amplifier 104, buffer circuit 110, a voltage divider (e.g., resistors R1 and R2), and an external load 106. Resistors R1 and R2 divide output voltage Vout to produce a divided output voltage Vo_div. Vo_div is coupled to one input of error amplifier 104. A second input of error amplifier 104 receives a reference voltage, Vref. Error amplifier 104 compares the divided output voltage Vo_div to reference voltage Vref and produces an error signal that may be coupled to pass transistor 100. If Vout increases and causes the divided output voltage to increase above the reference voltage, the error signal drives the pass transistor to reduce current into the load and reduce Vout. If Vout decreases and causes the divided output voltage to fall below the reference voltage, the error signal drives the pass transistor to increase current into the load and increase Vout. Accordingly, the LDO operates to maintain a constant output voltage Vout over changing current demands of the load 106.

In many application it would be desirable to have a buffer circuit with a wide output range that can drive an input of a subsequent circuit stage to a low voltage for a given range of voltage inputs, for example. For instance, referring to FIG. 1B, a buffer circuit 110 may be used between error amplifier 104 and pass transistor 100 to increase the drive strength to the pass transistor. However, if buffer circuit 110 has a constrained output voltage range, the output of the buffer circuit may not be able to drive the input of the pass transistor across a range of voltages for optimum performance. In particular, large currents into load 106 may require a buffer circuit in an LDO application to drive the input of the pass transistor close to ground. Accordingly, it would be advantageous to have wide output range buffer circuits and methods with improved output ranges in LDO and many other applications.

SUMMARY

The present disclosure pertains to buffer circuits and methods. In one embodiment, a buffer circuit includes a voltage shift circuit to extend an output voltage range of the buffer circuit for a given input voltage range. A voltage drop across the voltage shift circuit may change based on a current from the voltage shift circuit.

In one embodiment, a buffer circuit with a voltage shift circuit is used to drive the pass transistor of a low dropout regulator (LDO) to improve the drive of a pass transistor.

In one embodiment, a current proportional to an output current of the pass transistor is coupled to the buffer to change the voltage across the voltage shift circuit based on the regulator output current.

In one embodiment, a circuit includes a first transistor having a control terminal, a first terminal, and a second terminal where the first transistor is a first device type. The control terminal of the first transistor receives an input signal. The circuit also includes a second transistor having a control terminal, a first terminal, and a second terminal where the second transistor is a second device type. The control terminal of the second transistor is coupled to the second terminal of the first transistor. A voltage shift circuit has an input coupled to the first terminal of the first transistor and an output coupled to the first terminal of the second transistor and a voltage between the input of the voltage shift circuit and an output of the voltage shift circuit increases as a current from the output of the voltage shift circuit increases.

The following detailed description and accompanying drawings provide a better understanding of the nature and advantages of the present disclosure.

BRIEF DESCRIPTION OF THE DRAWINGS

FIGS. 4A-B illustrate the operating principle of buffer circuit and voltage shifter for high LDO load current.

DETAILED DESCRIPTION

The present disclosure pertains to buffer circuits. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1A:
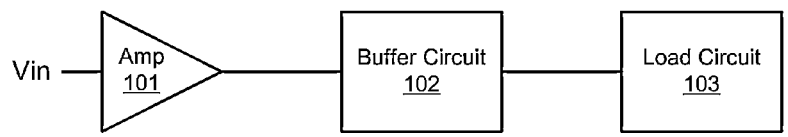
FIG. 1A shows an example application of a buffer circuit.
Figure 1B:
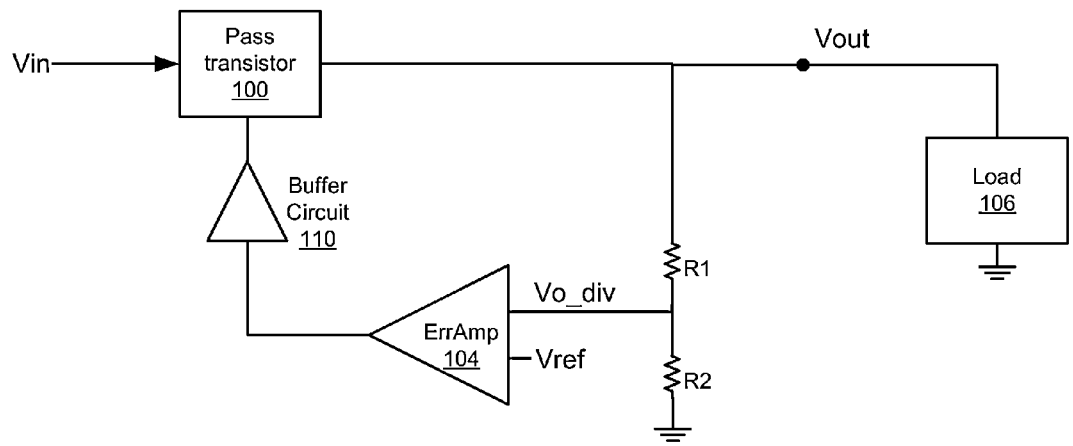
FIG. 1B shows an example application of a buffer circuit in an LDO.
Figure 2A:
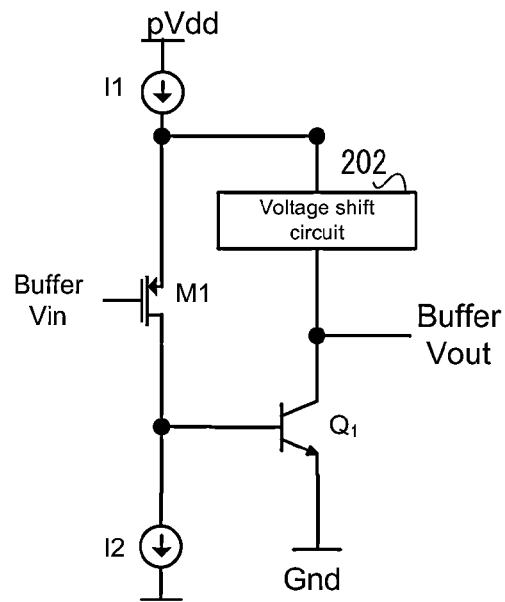
FIG. 2A shows an example buffer circuit that includes a voltage shift circuit according to one embodiment.

Features and advantages of the present disclosure include buffer circuits having improved drive capability. For example, in one embodiment, a buffer circuit includes voltage shift that increases as current increases to extend an output voltage range of the buffer. FIG. 2A shows an example buffer circuit that includes a voltage shift circuit according to one embodiment. The buffer circuit may include a first transistor M1 having a control terminal to receive an input signal (here a voltage signal, Buffer Vin), a first terminal coupled to a bias current I1, and a second terminal coupled to a bias current I2, for example. In this example, transistor M1 is an MOS (PMOS in particular) transistor, but in other embodiments other device types may be used. A second transistor Q1 includes a control terminal coupled to the drain terminal of M1, a first terminal coupled to an output of the buffer circuit, and a second terminal coupled to reference voltage (e.g., ground). In this example, transistor Q1 is a bipolar (NPN in particular) transistor, but in other embodiments other device types may be used. A voltage shift circuit 202 (also referred to as a "voltage shifter") has a first terminal coupled to the first terminal of transistor M1 and a second terminal coupled to the output of the buffer circuit and to the first terminal of transistor Q1. A voltage across the terminals of voltage shift circuit 202 may increase as current from the output of the voltage shift circuit increases. For instance, if the output current of the buffer increases, the voltage drop across the voltage shift circuit may increase, thereby allowing the output of the buffer circuit to achieve lower output voltages to drive subsequent stages. Further details of the operation and advantages of the buffer circuit in FIG. 2A are set forth in more detail below.

Figure 2B:
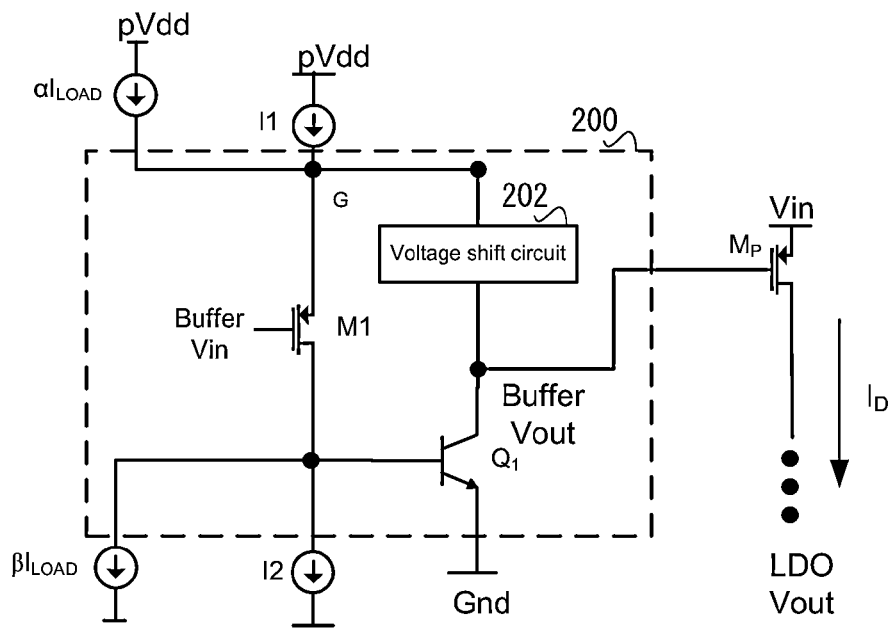
FIG. 2B shows an example buffer circuit in an LDO application according to one embodiment.

One advantageous application of the buffer circuit in FIG. 2A is in an LDO. FIG. 2B shows an example buffer circuit in an LDO application according to one embodiment. The LDO may receive an input voltage Vin and produce a regulated output voltage "LDO Vout," for example. Example applications of such an LDO may include use in a power management module of a portable device. In operation, buffer circuit 200 receives an input voltage "Buffer Vin" (e.g., from an error amplifier, not shown). Buffer circuit 200 outputs a buffer output voltage Buffer Vout to a control terminal of a pass transistor $M_P$ to regulate the output voltage LDO Vout of the LDO. As shown in buffer circuit 200, transistor M1 and transistor $Q_1$ are configured as was shown in FIG. 2A, which is sometimes referred to as a "super source follower." Buffer circuit 200 includes voltage shift circuit 202 between node G (here, the source of M1) and the node Buffer Vout (here, the collector of Q1). Voltage shift circuit 202 may adaptively shift the voltage at node Buffer Vout based on load current, which in one example implementation may include an LDO output current as described further below.

Embodiments of the present disclosure include buffer circuits comprising voltage shift circuits that create a voltage shift in the buffer proportional to a current. Embodiments of a voltage shifting buffer are illustrated herein by a "super source follower" buffer, but can be generalized to other kinds of buffer circuits, for example. In the example shown in FIG. 2B, an AC drain current in transistor M1 is multiplied by the current gain (or "beta") of Q1, which effectively boosts the transconductance (gm) of the buffer circuit by a factor of beta. When buffer Vin goes low, M1 drives current into Q1, current from Q1 increases, and the increased current causes the voltage across voltage shift circuit 202 to increase. The increased voltage drop across voltage shift circuit 202 allows the output voltage of the buffer, "Buffer Vout," to take on lower values closer to ground without dragging the drain of M1 low as well. This may have advantages in some applications as will be described in more detail below.

In this example, buffer circuit 200 receives bias currents I1 and I2, which may be fixed at constant bias current values. Additionally, in one embodiment, buffer circuit 200 may receive bias current proportional to the LDO load current $I_D$ (e.g., current $\alpha I_{LOAD}$, or current $\beta I_{LOAD}$, or both). Accordingly, embodiments of the present disclosure include coupling a current proportional to an LDO load current (e.g., an "adaptive bias current") to a voltage shift circuit in a buffer to improve the drive capability of the buffer circuit.

For example, FIG. 2B shows adaptive bias currents related to LDO load current as current sources $\alpha I_{LOAD}$ (current source) and/or $\beta I_{LoAD}$ (current sink). Bias current sources I1 and I2 provide a current required for operation of the buffer circuit and may be fixed. However, the adaptive bias current through current sources $\alpha I_{LOAD}$ and/or $\beta I_{LOAD}$ may be proportional to the load current through transistor $M_P$ (current $I_D$). In other embodiments a single combined source with a constant current component and a component related to the output load current may be used. The circuit in FIG. 2B is simplified in that the circuit used to generate the adaptive bias currents from the LDO output has been omitted. Various implementations of adaptive bias current circuits to produce currents related to an LDO output current may be appreciated.

The LDO may operate in high output current states, low output current states, or intermediate output current states based on the requirements of a load. The voltage across voltage shift circuit 202 is different in high current states and low current states. For high LDO output currents, the voltage at node Buffer Vout should be sufficiently low to turn on transistor $M_P$ as needed. The output of the buffer is coupled to the gate of the pass transistor $M_P$. Thus, the voltage at node Buffer Vout is the gate voltage for transistor $M_P$. Accordingly, having a lower voltage at node Buffer Vout allows transistor $M_P$ to turn on more strongly. As the load current increases through transistor $M_P$, the adaptive bias current through voltage shift circuit 202 also increases, which provides a greater voltage drop across voltage shift circuit 202 to reduce Buffer Vout and drive larger currents through transistor $M_P$. Thus, the voltage drop across voltage shift circuit 202 shifts the voltage at the node Buffer Vout down to provide an improved overdrive voltage to the pass transistor $M_p$.

For smaller LDO output currents, the adaptive bias current through voltage shift circuit 202 is smaller and voltage shift circuit 202 provides a smaller voltage shift to the voltage at the node Buffer Vout. For example, as the adaptive bias current goes down, the voltage across voltage shift circuit 202 decreases. To turn off transistor $M_P$, the gate to source voltage of transistor $M_P$ should be reduced below the turn on voltage of transistor $M_P$. Because the voltage drop across voltage shift circuit 202 is small at low load currents, voltage shift circuit 202 does not significantly influence the highest buffer output voltage at node Buffer Vout that can be achieved. In other words, with the load current at or near 0 mA, the voltage drop across voltage shift circuit 202 is not influenced by the load current. The current through current sources I1 and I2 provides a small voltage drop across voltage shift circuit 202, but this voltage drop may not influence the voltage at node Buffer Vout significantly, and transistor $M_P$ can be turned off.

Accordingly, voltage shift circuit 202 provides a lower minimum output voltage for Buffer Vout at the buffer output node with minimal change in the maximum output voltage. This allows use of a smaller pass transistor size for transistor $M_P$, which leads to a smaller overall LDO silicon area and lower cost. Also, there may be little or no change to the buffer no-load quiescent currents I1 and I2.

Figures 3A, 3B:
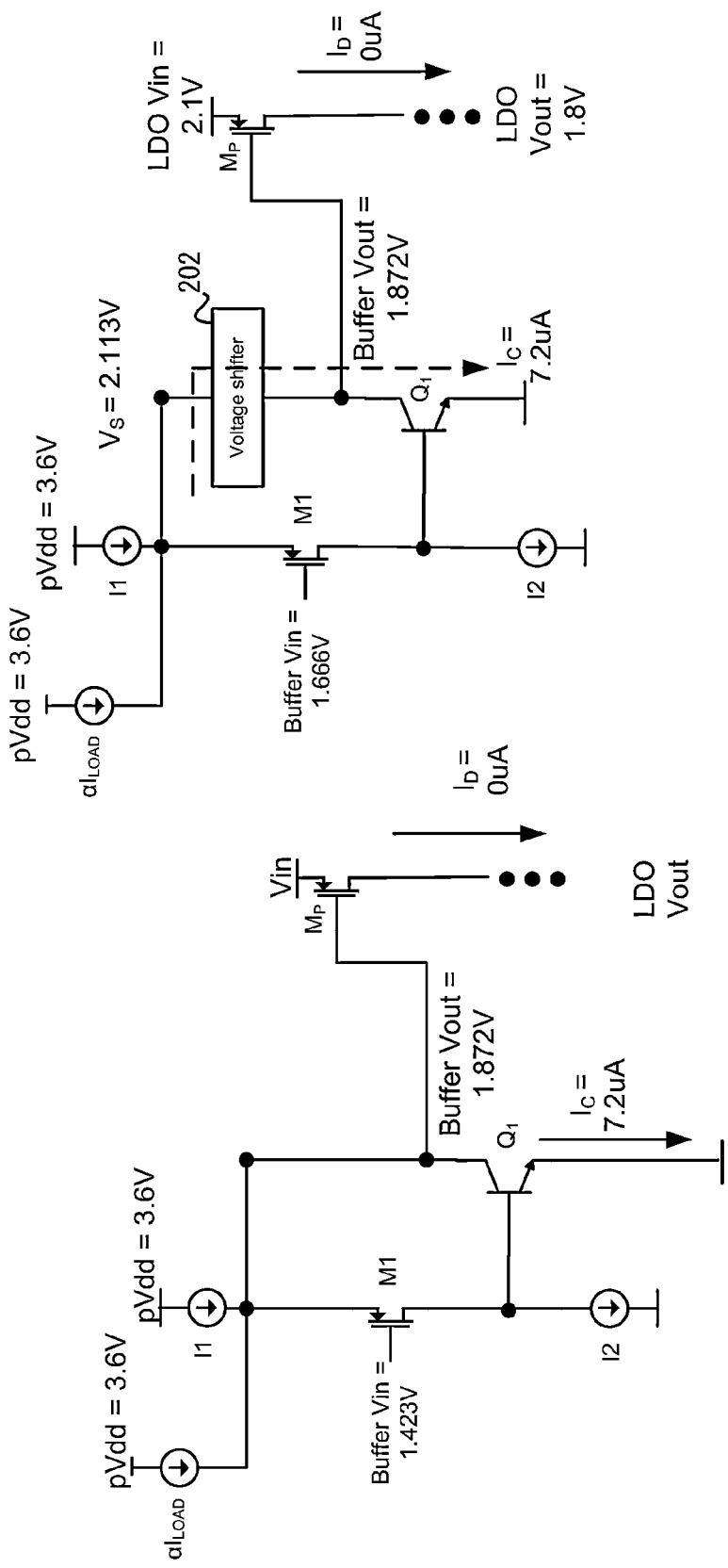
FIGS. 3A-B illustrate the operating principle of buffer circuit and voltage shifter for low LDO load current.

FIGS. 3A-B illustrate the operating principle of buffer circuit and voltage shifter for low load current. For comparison purposes, FIG. 3A describes an approach without using voltage shifter 202 and FIG. 3B describes the operating principle using voltage shifter 202.

In FIGS. 3A and 3B, the LDO output current $I_D$ (i.e., current into a load) is small (e.g., at or near 0 uA) and thus the load-dependent adaptive bias current $\alpha I_{LOAD}$ is small. In this case, the buffer output voltage BufferVout is high to produce a low LDO output current (e.g., LDO load current $I_D$=0 mA). That is, the high voltage at node BufferVout is needed to turn off transistor $M_P$.

Referring to FIG. 3A, in the buffer circuit without the voltage shift circuit, the source voltage of the input transistor M1 is high, and the gate voltage of transistor M1 is also high. For example, buffer circuit input and output voltages may be BufferVin=1.423V and BufferVout=1.872V. In this example, the high buffer output voltage can turn off transistor $M_P$ for both circuit configurations shown in FIGS. 3A and 3B.

Buffer input voltage Buffer Vin generates a current $I_C$ in Q1. In FIG. 3B, the small current $I_C$ is through voltage shifter 202 and introduces a small voltage drop across voltage shifter 202. In this case, the adaptive bias current $\alpha I_{LOAD}$ is low and $I_C$ is low. Thus, the voltage drop across voltage shifter 202 is based on the bias currents through current sources I1 and I2. To achieve a desired buffer output voltage of Buffer Vout=1.872V under light load conditions, the source voltage of input transistor M1 is $V_S$=2.133V. After stepping down by a gate to source voltage of the buffer input transistor M1, the gate voltage of transistor M1 is still not very high at Buffer Vin=1.666V. Thus, in this example, the buffer input voltage at transistor M1 required to achieve the desired buffer output voltage to turn off the pass transistor $M_P$ can be achieved with only a slight increase of the output voltage range of the error amplifier. That is, the output of the error amplifier may have to provide only a slightly higher input voltage to the buffer circuit (1.666V compared to 1.423V).

FIGS. 4A-B illustrate the operating principle of buffer circuit and voltage shifter for high load current. For comparison purposes, FIG. 4A shows a buffer circuit without using voltage shift circuit 202 and FIG. 4B shows the operating principle when using voltage shift circuit 202. When the load current $I_D$ is large, the load-dependent adaptive bias current is also large. In this case, the buffer output voltage Buffer Vout has to be low to drive pass transistor Mp to supply a high load current (e.g., LDO load current $I_D$=300 mA). The low voltage at node BufferVout turns on transistor $M_P$ to supply the high load current.

In FIG. 4A, in a buffer circuit without a voltage shift circuit, the source voltage of input transistor M1 is very low due to a low buffer input voltage of BufferVin=0.391V at the gate of transistor M1 required to produce the desired output current. This buffer input voltage results in a buffer output voltage at Buffer Vout=1.046V, which is low enough to turn on pass transistor $M_P$ and supply a high LDO output current of ID=300 mA.

In FIG. 4B, voltage shifter 202 introduces a voltage drop across it based on the large adaptive bias current from current source $\alpha I_{LOAD}$ that is proportional to the load current. To achieve the same buffer output voltage Buffer Vout=1.046V to drive the pass transistor, a source voltage $V_S$ of transistor M1 is $V_S$=1.653V. Thus, to achieve the higher load current, voltage shifter 202 introduces a voltage drop of 0.607V: 1.653V−1.046V=0.607V.

Even though the voltage at node BufferVout is the same in each circuit, the gate voltage of transistor M1 is higher using a voltage shift circuit (e.g., Buffer Vin=1.01V). The source voltage $V_S$ can be higher because voltage shifter 202 introduces the voltage drop. Having a higher buffer input voltage reduces the required output voltage range of the error amplifier. For example, in FIG. 3B, the buffer input voltage Buffer Vin was 1.666V and in FIG. 4B, the buffer input voltage Buffer Vin is 1.01V. This provides an input range of 1.01V–1.666V (a difference of 0.656V). In contrast, the circuit without a voltage shift in FIG. 3A has a buffer input voltage Buffer Vin of 0.391V and the circuit in FIG. 4A has a buffer input voltage Buffer Vin of 1.423V. The input range of the circuit without the voltage shift is thus 1.423V−0.391V=1.032V. Thus, the error amplifier output needs to have a range of 1.032 volts if a voltage shift is not used. However, the range needed for the error amplifier using voltage shifter 202 is much less at 0.656V.

Figure 5A:
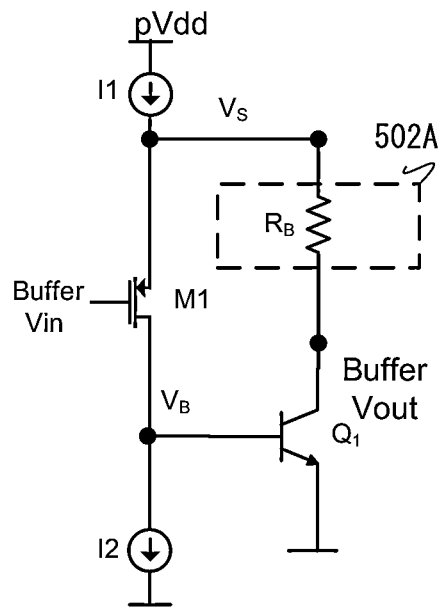
FIG. 5A shows an example of a voltage shift circuit in a buffer circuit according to one embodiment.
Figure 5B:
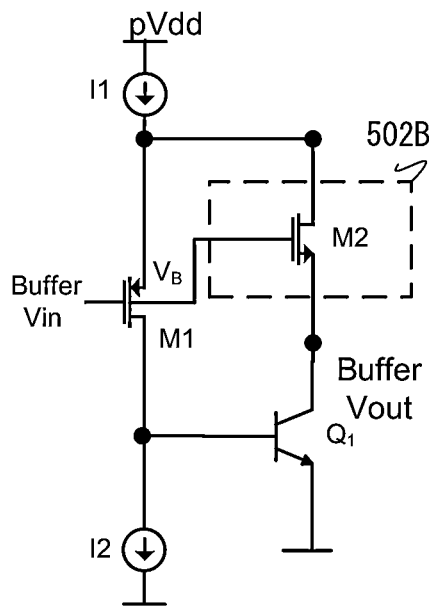
FIG. 5B shows another example of a voltage shift circuit in a buffer circuit according to one embodiment.

FIGS. 5A and 5B show different examples of voltage shift circuits according to two example embodiments.

In FIG. 5A, voltage shift circuit 502A includes a resistor $R_B$ according to one embodiment. When current flows through resistor $R_B$, a voltage drop occurs across the resistor. This achieves a voltage shift at node Buffer Vout. For example, when the current through Q1 increases (e.g., due to a decrease in Buffer Vin), the voltage across resistor $R_B$ increases. That is, the voltage drop across the resistor $R_B$ is proportional to the current through Q1 and the resistance of resistor $R_B$. Also, when the current through Q1 is low (e.g., due to an increase in Buffer Vin), the voltage drop across resistor $R_B$ is reduced. That is, the lower current provides a lower voltage drop across the resistor $R_B$.

FIG. 5B uses a transistor M2 in voltage shift circuit 502B according to one embodiment. In this case, when current flows through transistor M2, the gate-source voltage $V_{GS}$ across transistor M2 shifts the voltage at Buffer Vout. In particular, as the buffer input voltage Buffer Vin decreases, current through Q1 increases and the gate to source voltage of M2 (Vgs2) increases. Increasing current through Q1 and increasing Vgs2 of M2, in turn, increases the current through M2 and the drain to source voltage drop (Vds2) across M2. Accordingly, as the current at the source output terminal of M2 increases, M2 increases the voltage shift. Conversely, as the buffer input voltage Buffer Vin increases, the reverse effects occur, with current through Q1 decreasing, Vgs2 of M2 decreasing, and Vds2 of M2 decreasing. Accordingly, as the current at the source output terminal of M2 decreases, M2 decreases the voltage shift. In some example implementations, M2 may be a native MOS transistor which may have one or more of the following properties: low or even negative threshold voltage, no channel doping, and/or formation in a substrate, for example.

Using a transistor, such as an NMOS transistor shown in FIG. 5B, to replace the resistor shown in FIG. 5A, may also reduce the output impedance (e.g., compared to using resistor $R_B$) and reduce quiescent power consumption caused by bias currents through resistor $R_B$. For example, transistor M2 has a drain current dependent impedance of 1/gm, which is less than the impedance of using a fixed resistor $R_B$ especially in high load current conditions. Although the implementations shown above illustrate voltage shift circuit using a resistor or a transistor, voltage shift circuits may use different implementations to shift the voltage based on current.

Figure 6A:
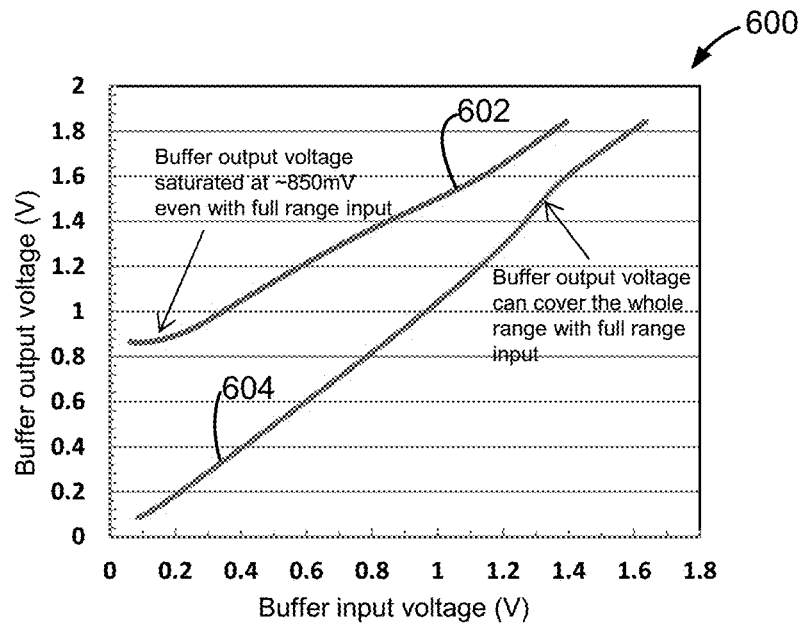
FIGS. 6A and 6B show graphs illustrating the buffer output voltage and load current in relation to buffer input voltage for one example buffer circuit according to one embodiment.
Figure 6B:
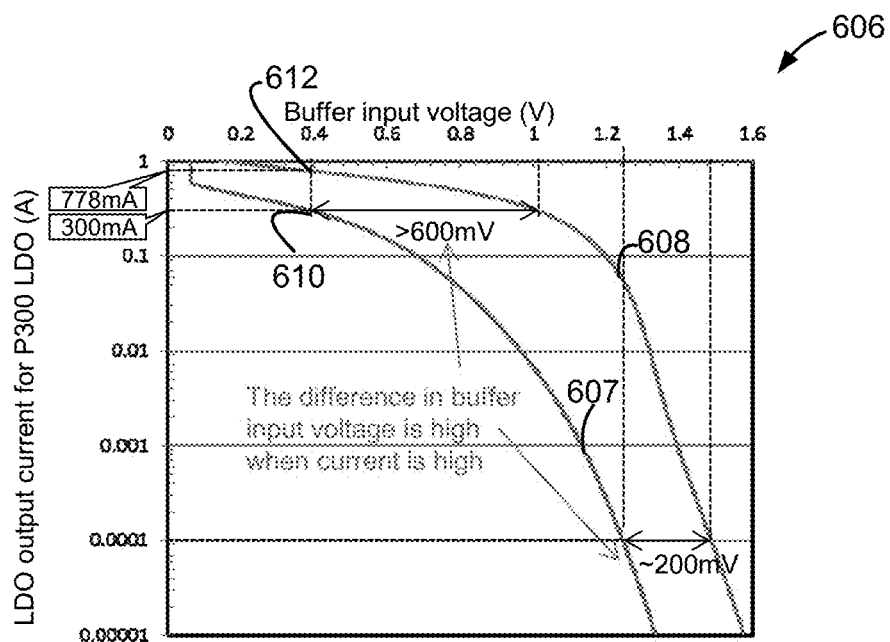

FIGS. 6A and 6B show graphs illustrating buffer output voltage and load current in relation to buffer input voltage for one example buffer circuit in an LDO according to one embodiment. FIG. 6A shows a graph 600 plotting the relationship of the buffer output voltage to the buffer input voltage for a particular circuit implementation. A line 602 shows the relationship without using voltage shift circuit and a line 604 shows the relationship when using a voltage shift circuit. Without a voltage shift circuit, the lowest buffer output voltage that can be achieved is around 850 mV for the lowest buffer input voltage. However, using voltage shift circuit, a wider range of buffer output voltages can be achieved for a given range of buffer input voltages. In this example implementation, the effective minimum output voltage is extended using a voltage shift.

Referring to FIG. 6B, a graph 606 shows the increased LDO driving capability provided by a buffer circuit including a voltage shift circuit. In graph 606, a line 607 shows the relationship between LDO output current to buffer input voltage without using a voltage shift circuit and a line 608 shows the relationship between the LDO output current and the buffer input voltage using voltage shift circuit. Using the buffer input voltage of 0.391V as shown in FIG. 4A, the load current $I_D$ of the buffer without the voltage shift circuit is 300 mA as shown at 610. However, using the same input voltage of 0.391 mV, using a voltage shift circuit, the output current of the LDO goes up to 778 mA as shown at 612. Thus, voltage shift circuit boosts the LDO driving capability by more than double.

As mentioned above, the area of pass transistor $M_P$ can be reduced using voltage shift circuits according to some embodiments. For one example LDO buffer circuit without a voltage shift circuit, the height of pass transistor $M_P$ may be 279 um. In one embodiment, using a voltage shift circuit, the height of the pass transistor $M_P$ may be reduced from 279 um to 182 um. This reduces the area needed for the pass transistor $M_P$ by 34%, for example. As the number of LDOs included in a chip increases, the area savings may become significant.

Figure 7:
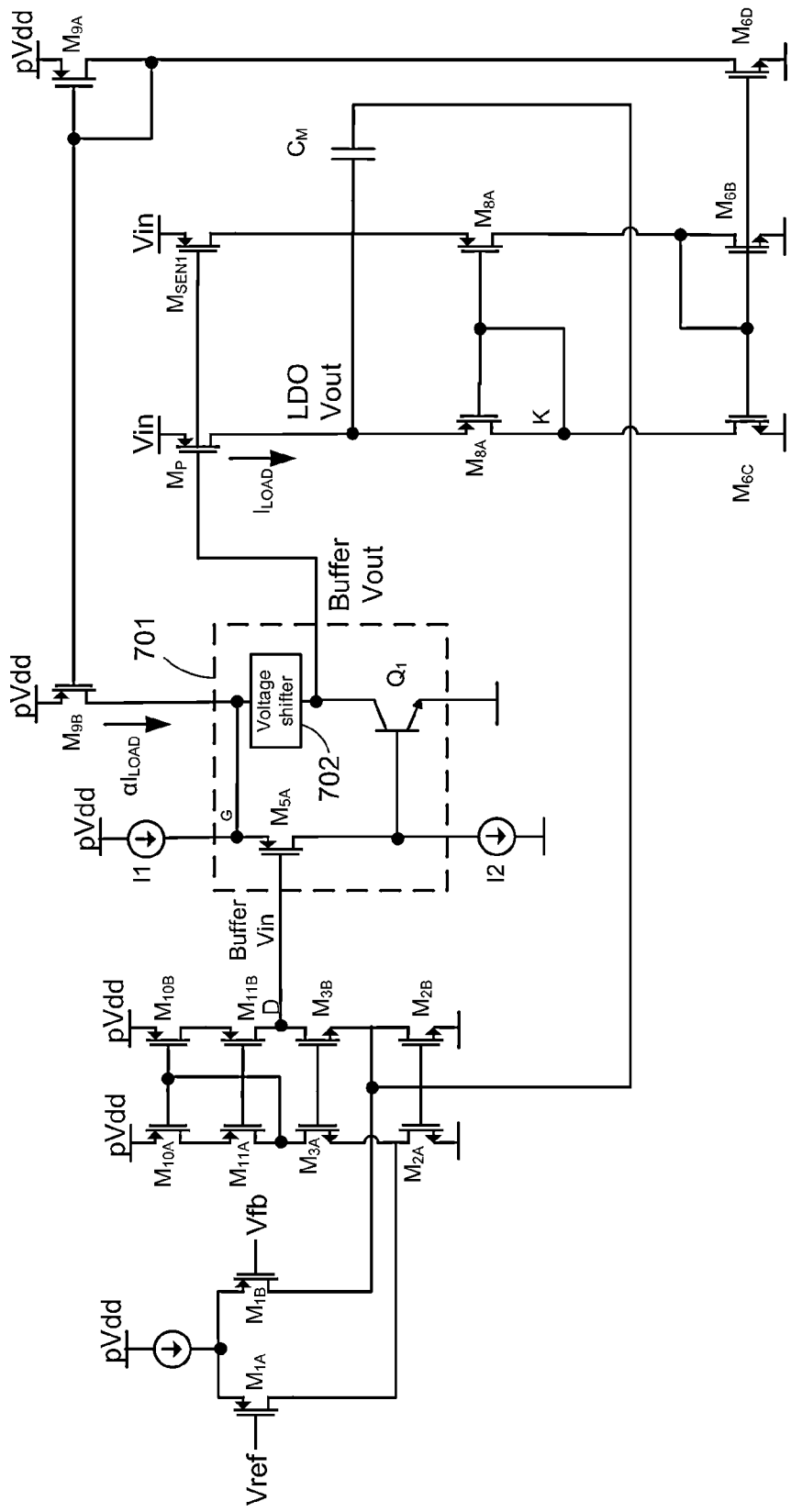
FIG. 7 shows another example of a buffer circuit in an LDO application according to one embodiment.

FIG. 7 shows another example of a buffer circuit in an LDO application according to one embodiment. The LDO includes an error amplifier (e.g., transistors $M_{1A-B}$, $M_{2A-B}$, $M_{3A-B}$, $M_{10A-B}$, and $M_{11A-B}$), a buffer circuit 701 including a voltage shift circuit 702, an output transistor (e.g., pass transistor $M_P$), an LDO output current sense transistor (e.g., $M_{SEN1}$), and an adaptive bias circuit (transistors $M_{6B-D}$, $M_{8A-B}$, and $M_{9A-B}$) to couple a current proportional to the LDO output current to buffer circuit 701. The error amplifier compares a reference voltage, Vref, to a feedback voltage, Vfb, corresponding to the LDO output voltage, LDO Vout. Vfb may be coupled from LDO Vout through a resistor divider to an input of the error amplifier, for example. The output of the error amplifier at node D is an error voltage representing the differential voltage between the LDO output voltage LDO Vout and the reference voltage. The adaptive bias circuit provides an adaptive bias current $\alpha I_{LOAD}$ to buffer 701 that is proportional to the load current $I_{LOAD}$ out of the node LDO Vout into an external load and sourced by transistor $M_P$.

Buffer 701 receives the error voltage (e.g., Buffer Vin) from the error amplifier and drives the pass transistor $M_P$ to maintain a constant output voltage LDO Vout. Buffer 701 may include a P channel MOSFET (PMOS) transistor $M_{5A}$ and an N-channel BJT (NPN) transistor $Q_1$. As mentioned above, the configuration of $M_{5A}$ and $Q_1$ is sometimes referred to as a "super source follower" configuration. The buffer output (e.g., node Buffer Vout) is coupled to a gate of pass transistor $M_P$ to drive the pass transistor of the LDO.

To minimize the size of transistor $M_P$ while maximizing the possible load current of the LDO, node G at the source of transistor $M_{5A}$ has to go as low as possible to drive the gate voltage on transistor $M_P$. In one example, the minimum voltage at node G may be set by the minimum drain to source voltage $V_{DSAT}$ of transistor $M_{2B}$ and transistor $M_{3B}$ (e.g., ~150 mV each at typical conditions) and the gate source voltage $V_{GS}$ of transistor $M_{5A}$ (e.g., ~1V at typical conditions). Thus, there is a limit as to how low the voltage at node G can go. As discussed above, during high load current conditions, it is desirable to reduce Buffer Vout to adequately turn on transistor $M_P$. However, due to the gate source voltage of $V_{GS}$ of transistor $M_{5A}$ and the drain-source voltages of transistor $M_{2B}$ and transistor $M_{3B}$, the minimum voltage at node Buffer Vout is limited. Thus, to provide the high load current, embodiments of the present disclosure may use voltage shifter 702 to extend the range of Buffer Vout for a given range of Buffer Vin, which allows the LDO to be designed with a smaller transistor size for transistor Mp. The smaller size decreases the silicon cost of the LDO. As mentioned above, in this example, without voltage shifter 702, the voltage at node Buffer Vout is equal to the maximum drain source voltage $V_{DSAT}$ of transistor $M_{2B}$ and transistor $M_{3B}$ (e.g., ~150 mV each at typical conditions) and the gate source voltage $V_{GS}$ of transistor $M_{5A}$ (e.g., ~1V at typical conditions). However, including voltage shifter 702, the voltage at node Buffer Vout becomes: $V_{DSAT}$ of transistor $M_{2B}$ and transistor $M_{3B}$ plus the gate to source voltage, $V_{GS}$, of transistor $M_{5A}$ minus the voltage drop across voltage shifter 702.

Figure 8:
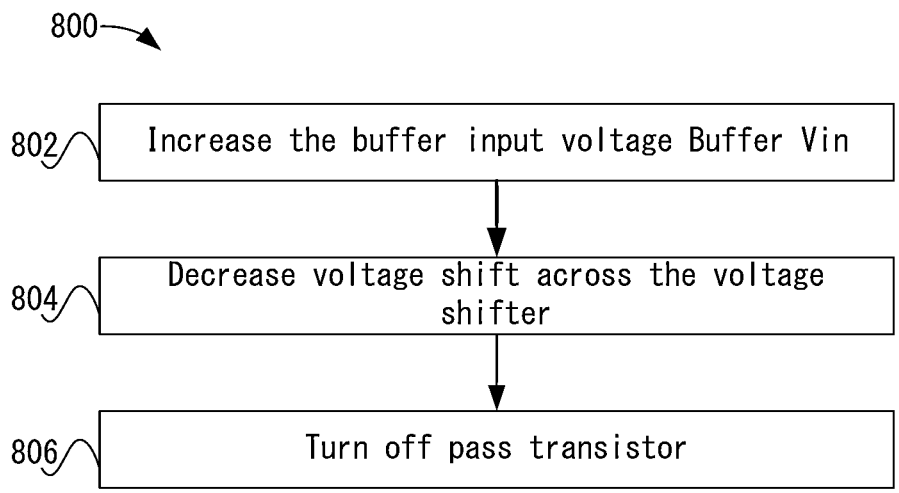
FIG. 8 depicts a simplified flowchart of a method according to one embodiment.

FIG. 8 depicts a simplified flowchart 800 of a method for using voltage shifter according to one embodiment. In this example, the LDO transits from high load current to low load current. At 802, an error amplifier increases the buffer input voltage Buffer Vin. At 804, as the buffer input voltage increases and the load current decreases, the voltage shift decreases. A bias current proportional to the load current and coupled to voltage shifter may also decrease. This causes the buffer output voltage Buffer Vout to increase. At 806, due to the buffer output voltage increasing, the pass transistor $M_P$ starts to turn off and the load current decreases.

Figure 9:
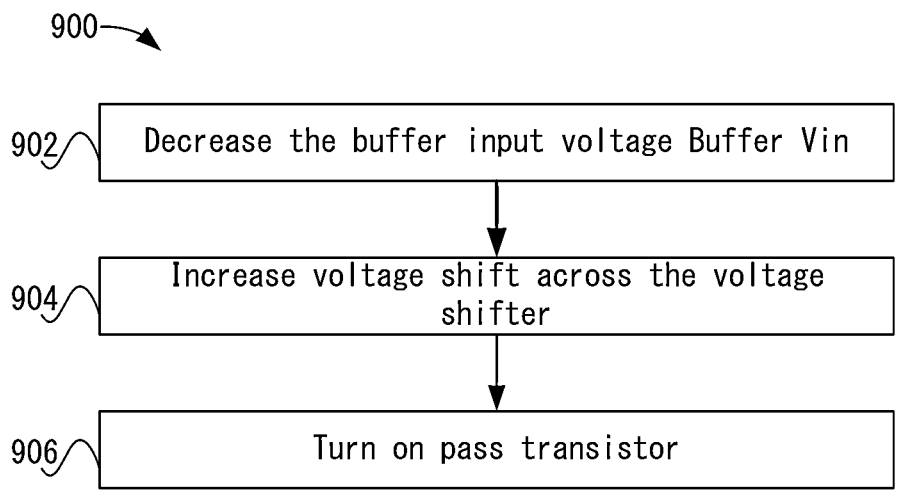
FIG. 9 depicts a simplified flowchart of another method according to one embodiment.

FIG. 9 depicts a simplified flowchart 900 of another method for using voltage shifter according to one embodiment. In this example, the LDO transits from the low load current to high load current. At 902, an error amplifier decreases the buffer input voltage Buffer Vin. At 904, as the buffer input voltage decreases and the load current increases, the voltage shift increases. A bias current proportional to the load current and coupled to voltage shifter may also increase. At 806, due to the buffer output voltage decreasing, the pass transistor $M_P$ starts to turn on and the load current increases.

Although that buffer circuit input transistor (e.g., M1 above) is shown as a PMOS transistor and transistor $Q_1$ is shown as an NPN transistor, it will be recognized that other implementations of transistors may be appreciated. For example, other transistor device types may be used. For example, transistor M1 may be a transistor of a first device type (e.g., polarity) and transistor $Q_1$ may be a second transistor of a second device type (e.g., opposite polarity). The term device type includes different devices (MOS and NPN) or polarity (P-type and N-type). In one example, transistor M1 and transistor $Q_1$ may also be the same device type (e.g., MOS devices), but different polarity.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
a first transistor having a control terminal, a first terminal, and a second terminal and being a first polarity, wherein the control terminal of the first transistor receives an input signal;
a second transistor having a control terminal, a first terminal, and a second terminal and being a second polarity, wherein the control terminal of the second transistor is coupled to the second terminal of the first transistor; and
a voltage shift circuit having first terminal coupled to the first terminal of the first transistor and a second terminal coupled to the first terminal of the second transistor, wherein a voltage between the first terminal of the voltage shift circuit and the second terminal of the voltage shift circuit increases as a current from the second terminal of the voltage shift circuit increases.

2. The circuit of claim 1, wherein:
the first transistor comprises a MOS transistor having a gate, a source, and a drain, wherein the gate of the first transistor receives the input signal;
the second transistor comprises a bipolar transistor having a base, an emitter, and a collector, wherein the base of the bipolar transistor is coupled to the drain of MOS transistor; and
the first terminal of the voltage shift circuit is coupled to the source of the first MOS transistor and the second terminal of the voltage shift circuit is coupled to the collector of the bipolar transistor.

3. The circuit of claim 1, wherein the voltage shift circuit comprises a resistor having a first terminal coupled to the first terminal of the first transistor and a second terminal coupled to the first terminal of the second transistor.

4. The circuit of claim 3, wherein:
the first transistor comprises a MOS transistor having a gate, a source, and a drain, wherein the gate of the first transistor receives the input signal;
the second transistor comprises a bipolar transistor having a base, an emitter, and a collector, wherein the base of the bipolar transistor is coupled to the drain of MOS transistor; and
the first terminal of the resistor is coupled to the source of the MOS transistor and the second terminal of the third transistor is coupled to the collector of the bipolar transistor.

5. The circuit of claim 1, wherein the voltage shift circuit comprises a third transistor having a control terminal, a first terminal, and a second terminal, wherein the control terminal of the third transistor is coupled to the control terminal of the first transistor, the first terminal of the third transistor is coupled to the first terminal of the first transistor, and the second terminal of the third transistor is coupled to the first terminal of the second transistor.

6. The circuit of claim 5, wherein:
the first transistor comprises a MOS transistor having a gate, a source, and a drain, wherein the gate of the first transistor receives the input signal;
the second transistor comprises a bipolar transistor having a base, an emitter, and a collector, wherein the base of the bipolar transistor is coupled to the drain of MOS transistor; and
the first terminal of the third transistor is coupled to the source of the MOS transistor and the second terminal of the third transistor is coupled to the collector of the bipolar transistor.

7. The circuit of claim 5, wherein the third transistor is a native MOS transistor.

8. The circuit of claim 1, further comprising:
a pass transistor of a regulator having a control terminal, a first terminal, and a second terminal, wherein the control terminal is coupled to the first terminal of the second transistor, wherein the second terminal of the voltage shift circuit drives the control terminal of the pass transistor of the regulator to regulate an output voltage at the second terminal of the pass transistor.

9. The circuit of claim 8, further comprising an adaptive bias current source generating a current to the voltage shift circuit proportional to a current through the second terminal of the pass transistor.

10. The circuit of claim 8, further comprising an error amplifier configured to compare an output voltage of the regulator to a reference voltage and output an error voltage as the input signal.

11. The circuit of claim 1, wherein:
the voltage between the first terminal of the voltage shift circuit and the second terminal of the voltage shift circuit increases as the current through the voltage shift circuit increases, and
the voltage between the first terminal of the voltage shift circuit and the second terminal of the voltage shift circuit decreases as the current through the voltage shift circuit decreases.

12. A method comprising:
receiving an input signal at the control terminal of the first transistor, the first transistor having a control terminal, a first terminal, and a second terminal and being a first polarity;
coupling a current from the second terminal of the first transistor to a control terminal of a second transistor, the second transistor having a control terminal, a first terminal, and a second terminal and being a second polarity;
generating a current in a voltage shift circuit, the voltage shift circuit having a first terminal coupled to the first terminal of the first transistor and a second terminal coupled to the first terminal of the second transistor, and
shifting a voltage at the first terminal of the first transistor between the first terminal of the voltage shift circuit and the second terminal of the voltage shift circuit, wherein a voltage at the second terminal of the voltage shift circuit decreases as a current from the output of the voltage shift circuit increases.

13. The method of claim 12, wherein the voltage shift circuit comprises a resistor.

14. The method of claim 12, wherein the voltage shift circuit comprises a third transistor having a control terminal, a first terminal, and a second terminal, wherein the control terminal of the third transistor is coupled to the control terminal of the first transistor, the first terminal of the third transistor is coupled to first terminal of the first transistor, and the second terminal of the third transistor is coupled to the first terminal of the second transistor.

15. The circuit of claim 14, wherein the third transistor is a native MOS transistor.

16. The method of claim 12, further comprising coupling a voltage from the second terminal of the voltage shift circuit to a control terminal of a pass transistor of a regulator to regulate an output voltage of the regulator at a second terminal of the pass transistor.

17. The method of claim 16, further comprising coupling a current proportional to a current from the second terminal of the pass transistor to the first terminal voltage shift circuit, wherein the voltage at the second terminal of the voltage shift circuit decreases as the current from the second terminal of the pass transistor increases.

18. The method of claim 12, wherein the input signal is from an error amplifier configured to compare an output voltage of the regulator to a reference voltage and output an error voltage as the input signal.

19. The method of claim 12, wherein:
- the voltage between the first terminal of the voltage shift circuit and the second terminal of the voltage shift circuit increases as the current through the voltage shift circuit increases, and
- the voltage between the first terminal of the voltage shift circuit and the second terminal of the voltage shift circuit decreases as the current through the voltage shift circuit decreases.

20. The method of claim 12, wherein:
- the first transistor comprises a MOS transistor having a gate, a source, and a drain, wherein the gate of the first transistor receives the input signal;
- the second transistor comprises a bipolar transistor having a base, an emitter, and a collector, wherein the base of the bipolar transistor is coupled to the drain of MOS transistor; and
- the first terminal of the voltage shift circuit is coupled to the source of the first MOS transistor and the second terminal of the voltage shift circuit is coupled to the collector of the bipolar transistor.

* * * * *